(12) United States Patent
Yang et al.

(10) Patent No.: US 11,899,227 B2
(45) Date of Patent: Feb. 13, 2024

(54) SOLAR REFLECTING FILM AND PREPARATION METHOD THEREOF

(71) Applicants: NINGBO RADI-COOL ADVANCED ENERGY TECHNOLOGIES CO., LTD., Ningbo (CN); NINGBO RUILING ADVANCED ENERGY MATERIALS INSTITUTE CO., LTD., Ningbo (CN)

(72) Inventors: Ronggui Yang, Ningbo (CN); Shaoyu Xu, Ningbo (CN); Minghui Wang, Ningbo (CN); Huailun Zhai, Ningbo (CN); Yulei Yan, Ningbo (CN); Zhengjie Yin, Ningbo (CN); Jinling Zhao, Ningbo (CN)

(73) Assignees: NINGBO RADI-COOL ADVANCED ENERGY TECHNOLOGIES CO., LTD., Ningbo (CN); NINGBO RUILING ADVANCED ENERGY MATERIALS INSTITUTE CO., LTD., Ningbo (CN)

(*) Notice: Subject to any disclaimer, the term of this patent is extended or adjusted under 35 U.S.C. 154(b) by 869 days.

(21) Appl. No.: 16/965,312

(22) PCT Filed: Apr. 10, 2020

(86) PCT No.: PCT/CN2020/084092
§ 371 (c)(1),
(2) Date: Jul. 28, 2020

(87) PCT Pub. No.: WO2021/017522
PCT Pub. Date: Feb. 4, 2021

(65) Prior Publication Data
US 2023/0161085 A1 May 25, 2023

(30) Foreign Application Priority Data

Jul. 31, 2019 (CN) .......................... 201910701748.7
Dec. 30, 2019 (CN) .......................... 201911387627.6

(51) Int. Cl.
*G02B 5/08* (2006.01)
*G02B 1/14* (2015.01)
(Continued)

(52) U.S. Cl.
CPC .......... *G02B 5/0816* (2013.01); *C23C 14/081* (2013.01); *C23C 14/083* (2013.01);
(Continued)

(58) Field of Classification Search
None
See application file for complete search history.

(56) References Cited

U.S. PATENT DOCUMENTS

2010/0086775 A1   4/2010 Lairson et al.
2017/0075045 A1*  3/2017 Medwick ................. G02B 5/10
(Continued)

FOREIGN PATENT DOCUMENTS

CN    102265190 Y    11/2011
CN    104459848 A     3/2015
(Continued)

OTHER PUBLICATIONS

International Search Report of PCT/CN2020/084092.
(Continued)

*Primary Examiner* — Bao-Luan Q Le
*Assistant Examiner* — Danell L Owens

(57) ABSTRACT

The present disclosure provides a solar reflecting film and a preparation method thereof. The solar reflecting film includes a substrate and a functional layer stacked on each other. The functional layer includes a first reflecting layer, a
(Continued)

barrier layer, and a second reflecting layer stacked on the substrate in order. The barrier layer includes a first barrier layer and a second barrier layer stacked on the first barrier layer. The first barrier layer is metal fluoride, inorganic non-metallic oxide, metal oxide or a combination thereof. The second barrier layer is metal oxides, metal nitrides, semiconductor doped compounds or a combination thereof. And a material of the first barrier layer is at least partially different from that of the second barrier layer.

19 Claims, 10 Drawing Sheets

(51) Int. Cl.
  C23C 14/08    (2006.01)
  C23C 14/10    (2006.01)
  C23C 14/20    (2006.01)
  C23C 14/35    (2006.01)
(52) U.S. Cl.
  CPC ............ *C23C 14/10* (2013.01); *C23C 14/205* (2013.01); *C23C 14/352* (2013.01); *G02B 1/14* (2015.01); *G02B 5/0891* (2013.01)

(56) References Cited

U.S. PATENT DOCUMENTS

| | | |
|---|---|---|
| 2018/0251886 A1 | 9/2018 | Lu et al. |
| 2018/0364402 A1 | 12/2018 | Ballou et al. |

FOREIGN PATENT DOCUMENTS

| | | |
|---|---|---|
| CN | 106796312 A | 5/2017 |
| CN | 108025952 | 5/2018 |
| CN | 106564242 B | 8/2018 |
| CN | 110103559 A | 8/2019 |
| JP | H07170366 A | 7/1995 |
| JP | 2001523358 A | 11/2001 |
| JP | 2006159580 A | 6/2006 |
| WO | WO2012113464 A1 | 8/2012 |
| WO | WO2018160616 A2 | 9/2018 |
| WO | WO2018232162 A1 | 12/2018 |

OTHER PUBLICATIONS

Abadias, G. et al. "Stress in thin films and coatings: Current status, challenges, and prospects", J. Vac. Sci. Technol., 2018, vol. A 36, 020801[2]. p. 17 left column, p. 36 right column, p. 37 right column, p. 38 left & right column may be relevant.
Tamulevicius, S. "Stress and strain in the vacuum deposited thin films", Vacuum, 1998, vol. 51, pp. 127 to 139[3]. p. 129 left column may be relevant.
Second examination report of AU2020210219.
First examination report of JP2020-541765.
Search Report of GC 2020-40178.
Search Report of TW109124475.
1OA of GC 2020-40178.
1OA of TW109124475.
Australia Office Action of 2020210219.
Singapore Office Action of 11202007260T.
Singapore Search Report of 11202007260T.
China Office Action of 201911387627.6.
EP Search report of EP 20187916.
Notice of Rejection of JP2020-541765.

\* cited by examiner

SOLAR REFLECTING FILM AND PREPARATION METHOD THEREOF

CROSS-REFERENCE TO RELATED APPLICATIONS

This application is a 35 U.S.C. § 371 national application of international PCT patent application PCT/CN2020/084092 filed on Apr. 10, 2020, which claims all benefits of priorities from China Patent Application Nos. 201910701748.7, filed on Jul. 31, 2019, with title of "PREPARATION METHOD OF HIGH REFLECTIVITY LAYER AND REFLECTIVE STRUCTURE", and 201911387627.6, filed on Dec. 30, 2019, with title of "BARRIER LAYER FILM STRUCTURE AND APPLICATION THEREOF", in the China National Intellectual Property Administration, the content of which is hereby incorporated by reference.

TECHNICAL FIELD

The present disclosure relates to the technical field of material science, and in particular, to a solar reflecting film and a preparation method thereof.

BACKGROUND

Silver film has high reflectivity in both visible and infrared wavelengths and presently, is the most common broadband and high reflecting film. However, when the thickness of the silver film is less than 170 nm, there will be a transmission window at the wavelength of 320 nm. That is, the ultraviolet light emitted from the light source will penetrate the silver film, and its transmittance and wavelength range will increase when the thickness of the silver film decreases, so that the full-spectrum reflectivity of the silver film in the whole solar wavelength band is not high.

In order to overcome the above technical defects, a variety of solutions have been used however these solutions inevitably and usually lead to new problems.

One solution is increasing the thickness of the silver film to avoid the transmission window, so that the full-spectrum reflectivity of the silver film in the whole solar wavelength band can be improved. However, due to the high price of silver, the increase of thickness of the silver film will inevitably increase the cost, and will lead to excessive stress of the film, which makes the silver film prone to fault peeling during bending and winding.

Another solution is combining silver and aluminum to make up for the technical defects. Specifically, aluminum can be directly sputtered on a silver film. However, this combination will lead to galvanic corrosion. That is, the electrochemical reaction between silver and aluminum leads to rapid oxidation of the silver film, which leads to a significant reduction of the expected life of the film. This solution also cannot obtain the reflecting films with great performance.

SUMMARY

The present disclosure provides a solution to the technical defects in the prior art.

The present disclosure provides a solar reflecting film which includes a substrate and a functional layer. The functional layer comprises a first reflecting layer, a barrier layer and a second reflecting layer stacked on the substrate in order. The barrier layer comprises a first barrier layer and a second barrier layer stacked on each other. The first barrier layer is metal fluoride, inorganic non-metallic oxide, metal oxide or a combination thereof. The second barrier layer is metal oxides, metal nitrides, semiconductor doped compounds or a combination thereof. And a material of the first barrier layer is at least partially different from that of the second barrier layer.

In one embodiment, the functional layer further comprises a protective layer on a side of the second reflecting layer away from the barrier layer In one embodiment, a material of the protective layer is metal fluoride, inorganic non-metal oxide, metal oxide, metal nitride, non-metal nitride, semiconductor doping compound, or a combination thereof.

In one embodiment, the functional layer further comprises a transition layer located between the substrate and the first reflecting layer In one embodiment, a material of the transition layer is metal fluoride, inorganic non-metal oxide, metal oxide, metal nitride, non-metal nitride, semiconductor doping compound, or a combination thereof.

In one embodiment, the solar reflecting film further comprises a composite adhesive layer and a protective film which are located on a surface of the functional layer away from the substrate in order.

In one embodiment, a sum of the thickness of the functional layer is less than or equal to 200 nm, a reflectivity of the solar reflecting film at a wavelength of 300 nm to 2500 nm is greater than or equal to 90%, and an anti-oxidation time of the solar reflecting film at 60° C. and 90% relative humidity is more than or equal to 720 hours, and a salt spray resistance time of the solar reflecting film is more than or equal to 240 hours.

In one embodiment, a thickness of the protective layer is in a range of 1 nm to 50 nm, and/or a thickness of the transition layer is in a range of 0.1 nm to 50 nm, and/or a thickness of the first reflecting layer is in a range of 20 nm to 120 nm, and/or a thickness of the second reflecting layer is in a range of 20 nm to 150 nm, and/or a thickness of the barrier layer is in a range of 10 nm to 45 nm.

In one embodiment, the first reflecting layer comprises a first layer and a second layer, the second layer is located on a side of the first layer away from the substrate, a thickness of the first layer is in a range of 0.1 nm to 40 nm, a thickness of the second layer is in a range of 20 nm to 80 nm.

In one embodiment, a thickness of the substrate is in a range of 1 μm to 10000 μm, a light transmittance of the substrate at wavelength of 300 nm to 2500 nm is greater than or equal to 80%.

In one embodiment, a material of the substrate is at least one of glass, poly (4-methyl-1-pentene), polyethylene terephthalate, polyethylene naphthalate, poly 1,4-cyclohexylene dimethylene terephthalate, poly (ethylene terephthalateco-1,4-cyclohexylene dimethylene terephthalate), poly (ethylene terephthalate-acetate), polymethyl methacrylate, polycarbonate, acrylonitrile styrene copolymer, acrylonitrile-butadiene styrene terpolymer, polyvinyl chloride, polypropylene, polyethylene, ethylene-propylene-diene monomer, polyolefin elastomer, polyamide, ethylene-vinyl acetate copolymer, ethylene-methyl acrylate copolymer, polyhydroxyethyl methacrylate, polytetrafluoroethylene, teflon perfluoroalkoxy, polytrifluorochloroethylene, ethylene-chlorotrifluoroethylene copolymer, ethylene-tetrafluoroethylene copolymer, polyvinylidene fluoride and polyfluoroethylene, thermoplastic polyurethane, and polystyrene.

In one embodiment, a material of the first reflecting layer is silver or silver alloy, and a material of the second reflecting layer is Al, Ti, Cu, W, or Ta.

In one embodiment, the barrier layer further comprises a third barrier layer between the first barrier layer and the second barrier layer, a material of the third barrier layer is metal fluoride, inorganic non-metal oxide, metal oxide, metal nitride, semiconductor doping compound, or a combination thereof, and a material of the third barrier layer is at least partially different from that of the first barrier layer and that of the second barrier layer.

In one embodiment, the metal fluoride is at least one of $MgF_2$, $BaF_2$, $YF_3$, $YbF_3$, $GdF_3$, $LaF_3$, and $AlF_3$, the inorganic nonmetal oxide is $SiO_2$, the metal oxide is at least one of $Y_2O_3$, $Al_2O_3$, ZnO, SnO, $TiO_2$, $Ta_2O_5$, $Nb_2O_5$, $ZrO_2$, and $HfO_2$, the metal nitride is at least one of $Mg_3N_2$, AlN, CrN, NiCrNx, HfN, TaN, TiN, TiAlN, and ZrN, and the semiconductor doping compound is at least one of AZO, ITO, IZO, ZTO, and GZO.

In one embodiment, the first barrier layer has at least one of the following features: a stress value is in a range of −5 GPa to −0.01 GPa, a refractive index is in a range of 1.3 to 1.8, and a thickness is in a range of 5 nm to 15 nm, the second barrier layer has at least one of the following features: a stress value is in a range of −5 GPa to −0.01 GPa, a refractive index is in a range of 1.8 to 2.5, and a thickness is in a range of 5 nm to 15 nm, the third barrier layer has at least one of the following features: a stress value is in a range of −5 GPa to −0.01 GPa, a refractive index is in a range of 1.8 to 2.5, and a thickness is in a range of 5 nm to 15 nm.

In one embodiment, calculated by thickness, a thickness relationship among the first barrier layer, the second barrier layer and the third barrier layer meets either one of the following two ratios:

a ratio of $\delta_1$ and $\delta_2$ is in a range of 3:1 to 1:3;
a ratio of $\delta_1$, $\delta_2$ and $\delta_3$ is in a range of 3:1:1 to 1:3:3;
wherein, a thickness of the first barrier layer is defined as $\delta_1$, a thickness of the second barrier layer is defined as $\delta_2$, and a thickness of the third barrier layer is defined as $\delta_3$.

The present disclosure provides a method for preparing a solar reflecting film, comprising:

providing a substrate; and forming a functional layer on the substrate by a magnetron sputtering method, to obtain the solar reflecting film. The functional layer comprises a first reflecting layer, a barrier layer and a second reflecting layer stacked on the substrate in order, and the barrier layer comprises a first barrier layer and a second barrier layer stacked on each other.

In one embodiment, the method further comprises:

providing a target material;

depositing the target material on the substrate by magnetron sputtering method, to form a first layer, wherein a supply power of the target material is $W_1$;

adjusting the supply power of the target material to $W_2$ and depositing a second layer on the first layer, wherein $W_2$ is greater than $W_1$, and the first layer and the second layer together form the first reflecting layer.

In one embodiment, $W_1$ is greater than or equal to 0.1 kW and smaller than 5 kW, and $W_2$ is greater than or equal to 5 kW and smaller than 20 kW.

In one embodiment, the method further comprises: forming a protective layer on a side of the second reflecting layer away from the barrier layer by a magnetron sputtering method, and/or forming a transition layer between the substrate and the first reflecting layer by a magnetron sputtering method.

The solar reflecting film provided by the present disclosure can reduce the thickness of each reflecting layer by adopting the double-reflecting layer comprising or consisting of the first reflecting layer and the second reflecting layer. On one hand, the cost can be saved while the full-spectrum reflectivity of the solar wavelength band is improved; on the other hand, the stress of the film itself can be reduced, and the phenomenon of fault peeling during bending and winding of the solar reflecting film can be avoided.

In addition, the barrier layer between the first reflecting layer and the second reflecting layer is used to block and stack. Meanwhile, by selecting the material of the barrier layer and reasonably using the multi-layer structure, the structural defects of each barrier layer unit can be made up, and gaps in the structure of the barrier layer can be effectively reduced or avoided. And then that the barrier between the first reflecting layer and the second reflecting layer is more thorough, the phenomenon of galvanic corrosion can be avoided, so that the anti-oxidation performance of the solar reflecting film under the conventional and extreme conditions can be improved. Moreover, the influence on reflection and transmission due to the gaps can be avoided, so that the full-spectrum reflectivity of the solar reflecting film can be further improved.

Therefore, the solar reflecting film provided by the present disclosure can have excellent reflectivity and oxidation resistance. Moreover, the cost will be low and the service life will be long.

Figure 1:
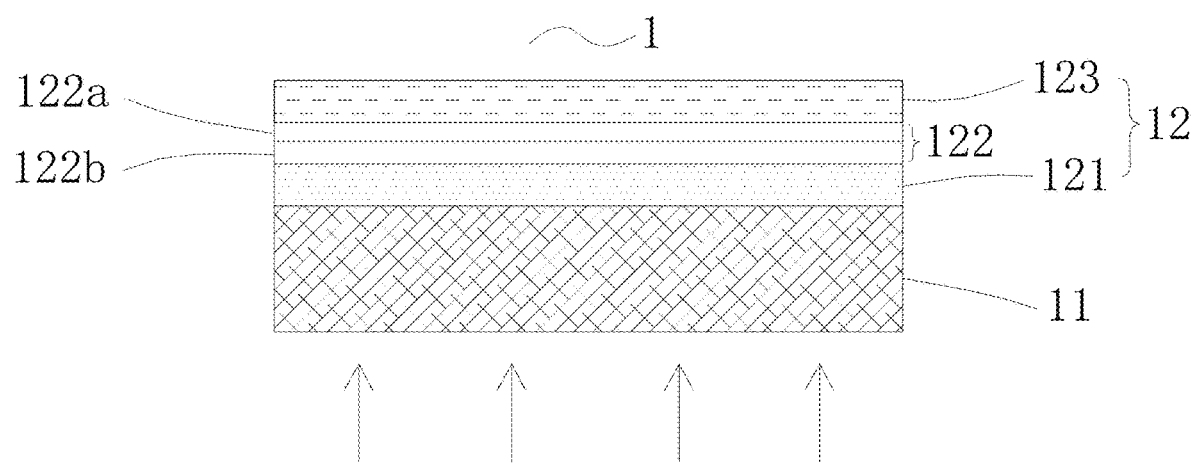
FIG. 1 is a schematic diagram of a solar reflecting film according to one embodiment of the present disclosure, wherein an arrow indicates a light incidence direction.

In the drawings: 1 represents a solar reflecting film; 11 represents a substrate; 12, represents a functional layer; 121 represents a first reflecting layer; 122 represents a barrier layer; 123 represents a second reflecting layer; 124 represents a transition layer; 125 represents a protective layer; 121a represents a first layer; 121b represents a second layer; 122a represents a first barrier layer; 122b represents a second barrier layer; and 122c represents a third barrier layer.

DETAILED DESCRIPTION

The technical proposals of the embodiments of the present disclosure will be clearly and completely described below by combining with drawings. It is obvious that the described embodiments are only a part and not all of the embodiments of the present disclosure. All other embodiments obtained by one skilled in the art based on the embodiments of the present disclosure without any creative efforts are within the scope of the present disclosure.

As shown in FIG. 1, an embodiment of the present disclosure provides a solar reflecting film 1. The solar reflecting film 1 can include a substrate 11 and a functional layer 12 stacked on top of one another. Typically, one side of the substrate 11 can be a light incident side, in which the light can pass through the substrate 11 to reach the functional layer 12, and after reflection of the functional layer 12, most of the light can be reflected back to the atmospheric environment through the substrate 11.

The functional layer 12 can include a first reflecting layer 121, a barrier layer 122 and a second reflecting layer 123 stacked on the substrate 11, in that order. The barrier layer 122 can include a first barrier layer 122a and a second barrier layer 122b stacked on top of each other. The first barrier layer 122a can be at least one of metal fluoride, inorganic non-metallic oxide and metal oxide. The second barrier layer 122b can be at least one of metal oxides, metal nitrides, and semiconductor doped compounds. A material of the first barrier layer 122a can be at least partially different from that of the second barrier layer 122b.

The solar reflecting film of the present disclosure can reduce the thickness of each reflecting layer by adopting the double-reflecting layer comprising or consisting of the first reflecting layer 121 and the second reflecting layer 123. On one hand, the cost can be reduced while the full-spectrum reflectivity of the solar wavelength band can be improved, and on the other hand, the stress of the film itself can be reduced, and the phenomenon of fault peeling during bending and winding of the solar reflecting film can be avoided.

In addition, the barrier layer 122 for blocking between the first reflecting layer 121 and the second reflecting layer 123 can prevent the occurrence of galvanic corrosion. However, it is found by the inventors that if the packing density of the barrier layer 122 is too low, a large number of small gaps may appear in the barrier layer 122, so that the barrier layer 122 can not only effectively block the first reflecting layer 121 and the second reflecting layer 123, but also the large number of small gaps may have a capillary action in a special environment, such as environment moisture or corrosive gas, which promotes a rapid occurrence of the galvanic corrosion phenomenon.

Therefore, by selecting the material of the barrier layer 122 and reasonably using the multi-layer structure, the structural defects of each barrier layer unit can be made up, and gaps in the structure of the barrier layer can be effectively reduced or avoided. The barrier between the first reflecting layer 121 and the second reflecting layer 123 is more thorough, and galvanic corrosion can be avoided so that the anti-oxidation performance of the solar reflecting film under the conventional and extreme conditions can be improved. In addition, the influence on reflection and transmission due to the existence of gaps can be avoided, so that the full-spectrum reflectivity of the solar reflecting film 1 can be further improved.

Figure 2:
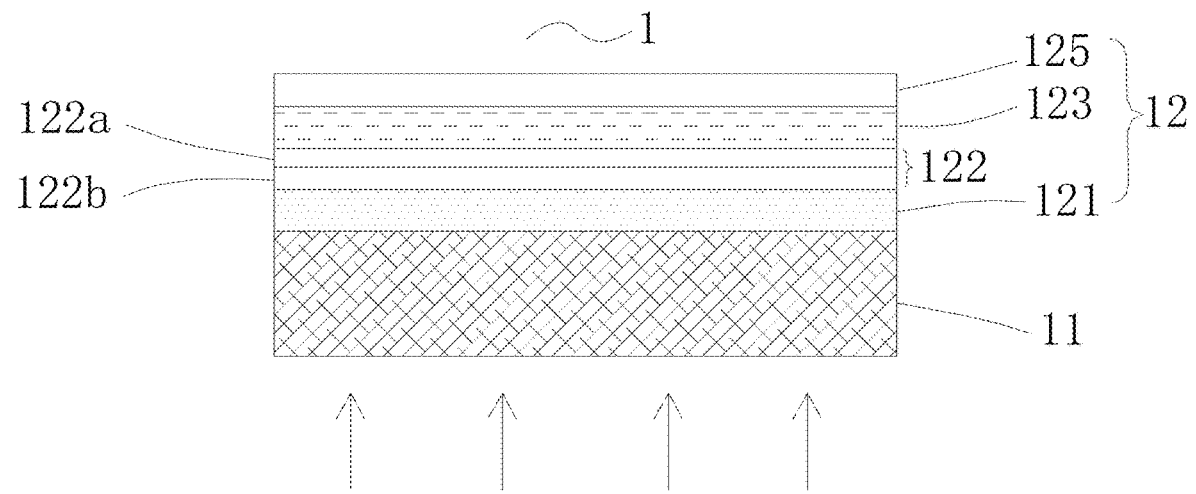
FIG. 2 is a schematic diagram of a solar reflecting film according to another embodiment of the present disclosure.

As shown in FIG. 2, another embodiment of the present disclosure provides a solar reflecting film 1. On the basis of the embodiment of FIG. 1, the functional layer 12 in this embodiment further includes a protective layer 125 located on a side of the second reflecting layer 123 away from the barrier layer 122. The protective layer 125 can improve the anti-oxidation performance of the solar reflecting film 1.

Specifically, a material of the protective layer 125 can be at least one of metal fluoride, inorganic non-metal oxide, metal oxide, metal nitride, non-metal nitride, and semiconductor doping compound.

Figure 3:
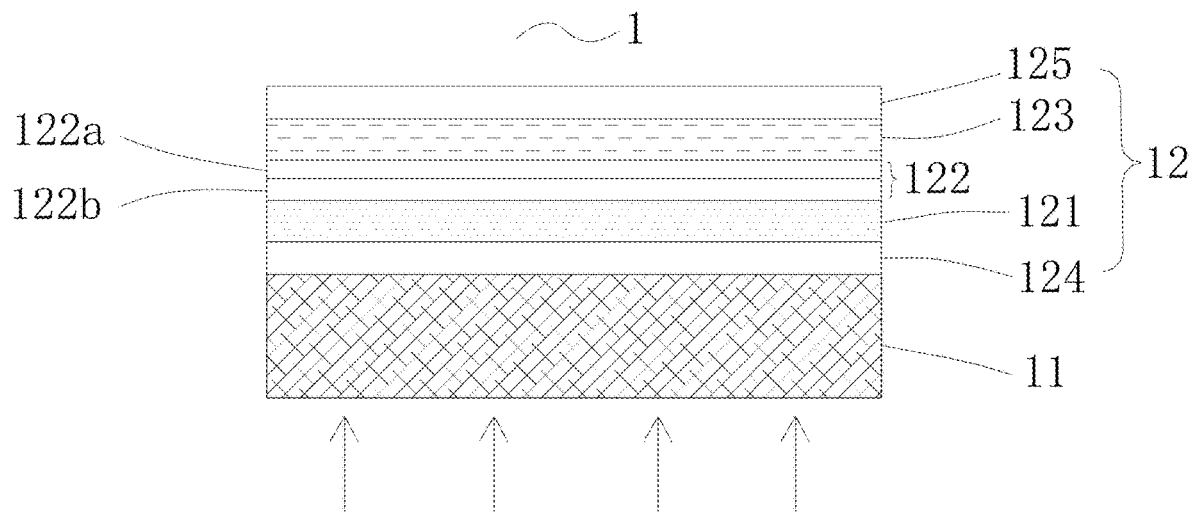
FIG. 3 is a schematic diagram of a solar reflecting film according to another embodiment of the present disclosure.

As shown in FIG. 3, another embodiment of the present disclosure provides a solar reflecting film 1. On the basis of the embodiment of FIG. 1 and/or the embodiment of FIG. 2, the functional layer 12 in this embodiment further includes a transition layer 124 located between the substrate 11 and the first reflecting layer 121. The transition layer 124 can improve the adhesion between the functional layer 12 and the substrate 11.

Specifically, a material of the transition layer 124 can be at least one of metal fluoride, inorganic non-metal oxide, metal oxide, metal nitride, non-metal nitride, and semiconductor doping compound.

Among materials of the protective layer 125 and the transition layer 124, the metal fluoride can be at least one of $MgF_2$, $BaF_2$, $yf_3$, $YbF_3$, $GdF_3$, $LaF_3$ and $AlF_3$; the inorganic nonmetal oxide can be $SiO_2$; the metal oxide can be at least one of $Y_2O_3$, $Al_2O_3$, $ZnO$, $SnO$, $TiO_2$, $Ta_2O_5$, $Nb_2O_5$, $ZrO_2$, and $HfO_2$; the metal nitride can be at least one of $Mg_3N_2$, AlN, CrN, NiCrNx, HfN, TaN, TiN, TiAlN, and ZrN; the non-metal nitride can be at least one of $Si_3N_4$, and BN; and the semiconductor doping compound can be at least one of Aluminium Zinc oxide (referred to as AZO), Indium Tin Oxide (referred to as ITO), Indium Zinc Oxide (referred to as IZO), Zinc Tin Oxide (referred to as ZTO), and Gallium Zinc Oxide (referred to as GZO).

Another embodiment of the present disclosure provides a solar reflecting film 1. On the basis of the embodiment of FIG. 1 and/or the embodiment of FIG. 2 and/or the embodiment of FIG. 3, the solar reflecting film 1 in this embodiment further includes a composite adhesive layer and a protective film located on the surface of the functional layer 12 away from the substrate 11 in order. The composite adhesive layer and the protective film can prevent the functional layer 12 from being oxidized, and further improve the anti-oxidation performance of the solar reflecting film 1 under extreme and normal conditions.

Specifically, a material of the composite adhesive layer can be at least one of polyurethane, polyacrylate, organosilicon, and epoxy resin, and preferably can be at least one of polyurethane and polyacrylate. A thickness of the composite adhesive layer can be in a range of 3 μm to 15 μm, preferably can be in a range of 5 μm to 10 μm.

Specifically, a material of the protective film can be a high molecular polymer, wherein, the high molecular polymer can be at least one of poly (4-methyl-1-pentene), polyethylene terephthalate, polyethylene naphthalate, poly 1,4-cyclohexylene dimethylene terephthalate, poly (ethyleneco-1,4-cyclohexylene dimethylene terephthalate, poly (ethylene terephthalate-acetate), polymethyl methacrylate, polycarbonate, polyvinyl chloride, polypropylene, polyethylene, polytetrafluoroethylene, teflon, perfluoroalkoxy, polychlorotrifluoroethylene, ethylene-chlorotrifluoroethylene copolymer, ethylene-tetrafluoroethylene copolymer, polyvinylidene fluoride and polyfluoroethylene, polystyrene. Preferably, the high molecular polymer includes polyethylene terephthalate, polyethylene naphthalate, poly 1,4-cyclohexylene dimethylene terephthalate, poly (ethyleneco-1,4-cyclohexylene dimethylene terephthalate. A thickness of the protective film can be in a range of 10 μm to 100 μm, preferably, in a range of 20 μm to 50 μm.

On the basis of the four embodiments described above, preferably, the sum of the thickness of the functional layer 12 is less than or equal to 200 nm. The reflectivity of the solar reflecting film 1 at the wavelength of 300 nm to 2500 nm can be greater than or equal to 90%. The oxidation resistance time of the solar reflecting film 1 under the high temperature and high humidity test can be more than or equal to 720 hours. The oxidation resistance time of the solar reflecting film 1 under the salt spray test can be more than or equal to 240 hours. The solar reflecting film 1 with low cost and high performance can be better applied to special outdoor environments such as humid environment or corrosive gas, e.g. coastal areas.

Specifically, a thickness of the protective layer 125 can be in a range of 1 nm to 50 nm, a thickness of the transition layer 124 can be in a range of 0.1 nm to 50 nm, a thickness of the first reflecting layer 121 can be in a range of 20 nm to 120 nm, a thickness of the second reflecting layer 123 can be in a range of 20 nm to 150 nm, a thickness of the barrier layer 122 can be in a range of 10 nm to 45 nm, and the sum of the thickness of the functional layer 12 is less than or equal to 200 nm by controlling the thickness of each layer.

Figure 4:
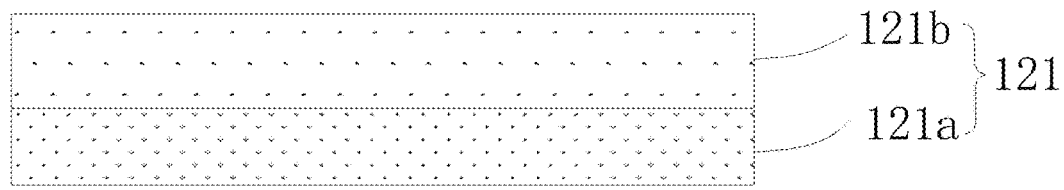
FIG. 4 is a schematic diagram of the first reflecting layer according to one embodiment of the present disclosure.

As shown in FIG. 4, the first reflecting layer 121 can include a first layer 121a and a second layer 121b, the second layer 121b can be located on a side of the first layer 121a away from the substrate 11, a thickness of the first layer 121a can be in a range of 0.1 nm to 40 nm, and a thickness of the second layer 121b can be in a range of 20 nm to 80 nm. The crystal grain of the first layer 121a is larger than that of the second layer 121b, so in the first layer 121a there are few defects such as grain boundary and the scattering degree is low, and the density of the second layer 121b is high. The first reflecting layer 121 formed by combining the first layer 121a and the second layer 121b can have the advantages of each layer and make up for the disadvantages of each layer, so as to obtain a film layer with high reflectivity.

Specifically, a thickness of the substrate 11 can be in a range of 1 μm to 10000 μm, and a light transmittance of the substrate 11 at the wavelength of 300 nm to 2500 nm can be greater than or equal to 80%.

The substrate 11 can be a glass or polymer material layer. The polymer material layer can include a polymer substrate layer. The polymer material layer further can include organic particles and/or inorganic particles dispersed in the polymer substrate layer, wherein a particle size of the organic particles and/or the inorganic particles can be in a range of 5 μm to 30 μm.

The polymer substrate layer can be made of a thermoplastic polymer. The thermoplastic polymer can be at least one of poly (4-methyl-1-pentene), polyethylene terephthalate, polyethylene naphthalate, poly 1,4-cyclohexylene dimethylene terephthalate, poly (ethylene terephthalateco-1,4-cyclohexylene dimethylene terephthalate), poly (ethylene terephthalate-acetate), polymethyl methacrylate, polycarbonate, acrylonitrile styrene copolymer, acrylonitrile-butadiene styrene terpolymer, polyvinyl chloride, polypropylene, polyethylene, ethylene-propylene-diene monomer, polyolefin elastomer, polyamide, ethylene-vinyl acetate copolymer, ethylene-methyl acrylate copolymer, polyhydroxyethyl methacrylate, polytetrafluoroethylene, teflon perfluoroalkoxy, polytrifluorochloroethylene, ethylene-chlorotrifluoroethylene copolymer, ethylene-tetrafluoroethylene copolymer, polyvinylidene fluoride and polyfluoroethylene, thermoplastic polyurethane, and polystyrene.

The inorganic particles can be at least one of silicon dioxide particles, silicon carbide particles, aluminum hydroxide particles, aluminum oxide particles, zinc oxide particles, barium sulfide particles, magnesium silicate particles, barium sulfate particles, calcium carbonate particles, and titanium dioxide particles.

The organic particles can be at least one of acrylic resin particles, silicone resin particles, nylon resin particles, polystyrene resin particles, polyester resin particles, and polyurethane resin particles.

The first reflecting layer 121 can be made of silver or silver alloy, and the second reflecting layer 123 can be made of Al, Ti, Cu, W, or Ta. The silver alloy is composed of the following components in percentage by weight: silver in a range of 80% to 99.99% and a residual part in a range of 0.01% to 20%. The residual part is composed of inevitable impurities and at least one of Rn, Co, Cu, In, Nd, Ge, Sn, Si, Pt, Pd, Zn, Cd and Au.

Figure 5:
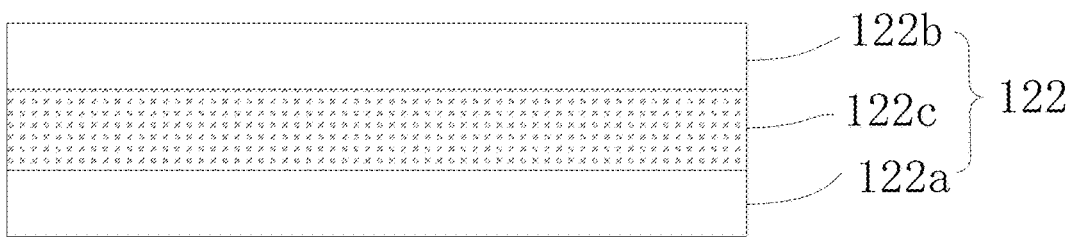
FIG. 5 is a schematic diagram of the barrier layer according to one embodiment of the present disclosure.

As shown in FIG. 5, the barrier layer 122 can further include a third barrier layer 122c. The third barrier layer 122c can be at least one of metal fluoride, inorganic nonmetal oxide, metal oxide, metal nitride, and semiconductor doping compound. Materials of the first barrier layer 122a, the second barrier layer 122b and the third barrier layer 122c are not exactly the same, or at least partially different. Preferably, the third barrier layer 122c can be located between the first barrier layer 122a and the second barrier layer 122b.

The metal fluoride can be at least one of $MgF_2$, $BaF_2$, $YF_3$, $YbF_3$, $GdF_3$, $LaF_3$ and $AlF_3$. The inorganic nonmetal oxide can be $SiO_2$. The metal oxide can be at least one of $Y_2O_3$, $Al_2O_3$, ZnO, SnO, $TiO_2$, $Ta_2O_5$, $Nb_2O_5$, $ZrO_2$ and $HfO_2$. The metal nitride can be at least one of $Mg_3N_2$, AlN, CrN, NiCrNx, HfN, TaN, TiN, TiAlN and ZrN. And the semiconductor doping compound can be at least one of AZO, ITO, IZO, ZTO, and GZO.

When selecting the material of the barrier layer, it is necessary to meet the basic requirements of no radioactivity. In addition, the material of the barrier layer should be non-toxic or low toxic. When forming a film with a certain thickness, the material should have the characteristics of high light transmittance, compactness, low absorption, easy to sputter and shape, and insoluble. Preferably, the material of the barrier layer can be at least one of $MgF_2$, $BaF_2$, $YF_3$, $YbF_3$, $GdF_3$, $LaF_3$, $AlF_3$, $SiO_2$, $Y_2O_3$, $Al_2O_3$, ZnO, SnO, $TiO_2$, $Ta_2O_5$, $Nb_2O_5$, $ZrO_2$, $HfO_2$, $Mg_3N_2$, AlN, CrN, NiCrNx, HfN, TaN, TiN, TiAlN, ZrN, $Si_3N_4$, BN, AZO, ITO, IZO, ZTO and GZO.

The first barrier layer 122a can have at least one of the following features: a stress value can be in a range of −5 GPa to −0.01 GPa, a refractive index can be in a range of 1.3 to 1.8, and a thickness can be in a range of 5 nm to 15 nm.

The second barrier layer 122b can have at least one of the following features: a stress value can be in a range of −5 GPa to −0.01 GPa, a refractive index can be in a range of 1.8 to 2.5, and a thickness can be in a range of 5 nm to 15 nm.

The third barrier layer 122c can have at least one of the following features: a stress value can be in a range of −5 GPa to −0.01 GPa, a refractive index can be in a range of 1.8 to 2.5, and a thickness can be in a range of 5 nm to 15 nm The tensile stress is represented by "+" and the compressive stress is expressed by "−". The barrier layer 122 presenting the compressive stress can obtain a more compact microstructure, and in the whole solar reflecting film 1, the overall stress of the solar reflecting film 1 can be reduced or even compensated by the mutual stacking and sputtering of the tensile stress material and the compressive stress material, which helps to prevent the spalling of the first reflecting layer 121 and the second reflecting layer 123. The magnitude of the stress is not only dependent on the materials of the barrier layer 122, but also related to the thickness of the barrier layer 122. The relationship between stress and thickness is not always positive or negative. Taking the stable growth of thickness as the observation axis, in the initial stage with a thinner barrier layer 122, the stress is positively correlated with the thickness, i.e., the stress increases as the thickness of the barrier layer 122 increases; when the barrier layer 122 merges into a network structure from the island structure, the stress presents a maximum value, and then begins to decay, that is, from positive correlation to negative correlation; at a middle stage of this time, the thickness of the barrier layer 122 continues to increase, causing a recrystallization phenomenon, and the stress is gradually reduced; and when the stress experiences the lowest value, the stress is converted into positive correlation again, and the later stage is entered.

The stress value, the refractive index and the thickness are not necessarily influenced by each other, and the value of each parameter is only a single or comprehensive optimization. The specific value of each parameter can be adjusted according to actual conditions. Preferably, the stress can be in a range of −1 GPa to 0.1 GPa, and the thickness can be in a range of 5 nm to 10 nm.

Further, a thickness relationship among the first barrier layer, the second barrier layer and the third barrier layer meets either one of the following two ratios:

a ratio of $\delta_1$ and $\delta_2$ is in a range of 3:1 to 1:3;

a ratio of $\delta_1$, $\delta_2$ and $\delta_3$ is in a range of 3:1:1 to 1:3:3;

wherein, $\delta_1$ represents the thickness of the first barrier layer 122a, $\delta_2$ represents the thickness of the second barrier layer 122b, and $\delta_3$ represents the thickness of the third barrier layer 122c.

According to different kinds of barrier layer unit materials, a thickness ratio of the barrier layer unit is also different, and generally the preferred value range can be as described above. The barrier layer unit can be the first barrier layer 122a, the second barrier layer 122b, or the third barrier layer 122c. In any case, the thickness ratio of the barrier layer units cannot be too large or too small, i.e., not exceed three times the difference between each other.

Further, the barrier layer 122 can include at least one of the following materials stacking method:

a, the first barrier layer 122a is an $Al_2O_3$ layer, and the second barrier layer 122b is a $TiO_2$ layer;

b, the first barrier layer 122a is a $YF_3$ layer, and the second barrier layer 122b is a $Y_2O_3$ layer;

c, the first barrier layer 122a is a $SiO_2$ layer, and the second barrier layer 122b is a $Ta_2O_5$ layer;

d, the first barrier layer 122a is an $Al_2O_3$ layer, the second barrier layer 122b is a $TiO_2$ layer, and the third barrier layer 122c is a $SiO_2$ layer;

e, the first barrier layer 122a is an AlN layer, the second barrier layer 122b is an ITO layer, and the third barrier layer 122c is a $YF_3$ layer;

f, the first barrier layer 122a is a $YBF_3$ layer, the second barrier layer 122b is a $Y_2O_3$ layer, and the third barrier layer 122c is a $ZrO_2$ layer.

The main principle of the stacking methods a, b, and c is as follows: under the premise of ensuring that the barrier layer 122 does not have a loose columnar structure, layering (e.g., sputtering) the low refractive index material and the high refractive index material, through the optical interference principle of the film layer further enhances the reflectivity of the solar light band.

In addition to the principle above, in the stacking method d, e, and f, the bonding force of barrier layer 122 can be further improved, and the possibility of loose columnar structure can be further reduced; in the stacking method d, due to the fact that the $SiO_2$ layer is added, reaction between $Al_2O_3$ and $TiO_2$ can be prevented, then the phenomenon of white turbidity can be prevented.

Further, the step of forming the barrier layer 122 can include: sequentially disposing each unit barrier layer of the barrier layer 122 on the first reflecting layer 121 by a sputtering method. For example, the first barrier layer 122a can be disposed on the first reflecting layer 121, or the second barrier layer 122b can be disposed on the first reflecting layer 121.

Further, in the step of forming the barrier layer 122, when any layer of the barrier layer units includes a metal oxide, the sputtering environment of the barrier layer 122 with an initial thickness of at least 3 nm is an oxygen-free environment.

Figure 6:
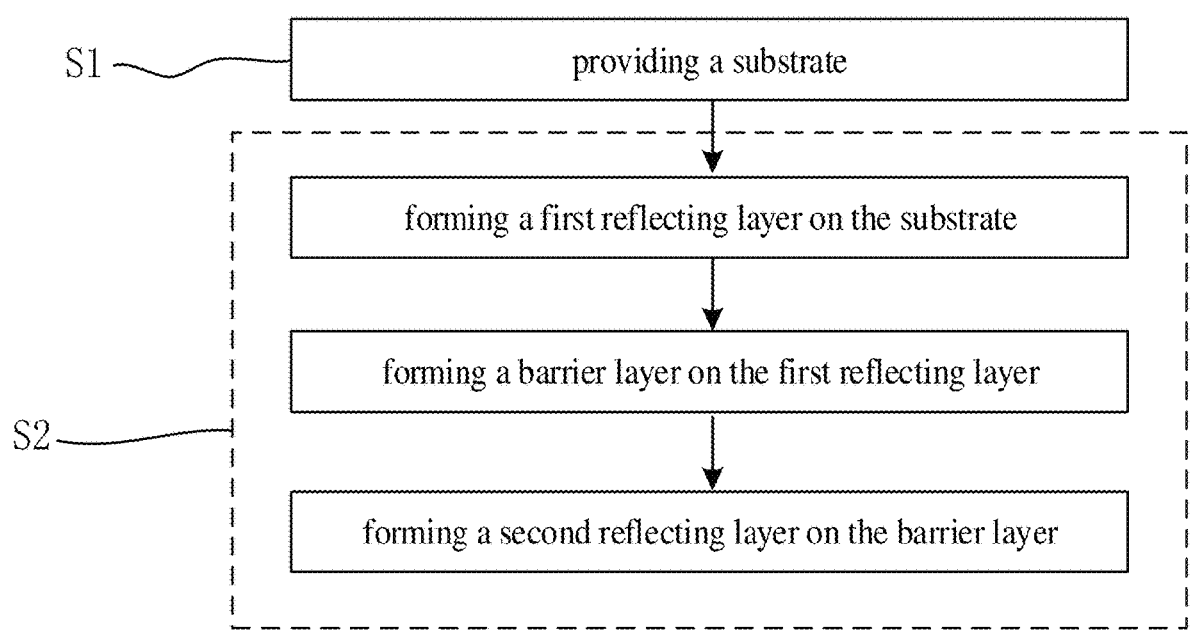
FIG. 6 is a flow diagram of a method for preparing a solar reflecting film according to one embodiment of the present disclosure.

As shown in FIG. 6, the present disclosure further provides a preparation method of the solar reflecting film 1, which includes the following steps:

S1, providing a substrate 11;

S2, forming a functional layer 12 on the substrate 11 by magnetron sputtering method to obtain the solar reflecting film 1, wherein the functional layer 12 includes a first reflecting layer 121, a barrier layer 122 and a second reflecting layer 123 stacked on the substrate 11 in order, and the barrier layer 122 includes a first barrier layer 122a and a second barrier layer 122b stacked on each other.

It is found by the inventors that if only a single power is used to prepare the reflecting layer, the structures of the reflecting layer prepared by different supply power of the target material have a large difference. For example, if choosing a single high-power coating process, the prepared layer has high compactness and low light transmittance, but the grain size is small and the grain boundary increase, resulting in the increase of scattering; while if choosing a single low-power coating process, the prepared layer has large grain size, few grain boundary, and low scattering, but the compactness of the prepared layer is low, holes are formed, and the light transmittance is increased. The above phenomenon is due to the different deposition rate of target material under different supply power. Then the inventions further provide a preparation method of the first reflecting layer 121, including:

S21, providing a target material;

S22, depositing the target material on the substrate 11 by magnetron sputtering method, to form a first layer 121a, wherein a supply power of the target material is a first power $W_1$;

S23, adjusting the supply power of the target material to a second power $W_2$, wherein $W_2 > W_1$, depositing a second layer 121b on the first layer 121a, the first layer 121a and the second layer 121b together form a first reflecting layer 121.

Therefore, when the first layer 121a is deposited, the supply power of the target material is low, which is beneficial to form large grains with fewer defects such as grain boundaries, and the scattering degree is low, which is beneficial to improve the reflectivity. However, due to the large grain size, the density of the first layer 121a is poor, and a part of light can pass through the first layer 121a and arrive at the second layer 121b. When the second layer 121b is deposited, the supply power of the target material is high, which is beneficial to form a film with high compactness and low light transmittance. Therefore, the first reflecting layer 121 formed by the first layer 121a and the second layer 121b can effectively combine the advantages of each layer and make up for the disadvantages of each layer, so as to obtain a film layer with high reflectivity.

In addition, when depositing the second layer 121b on the first layer 121a with higher supply power, the first layer 121a is bombarded, which is beneficial to improve the compactness of the first layer 121a, and then the reflectivity of the first layer 121a can be improved.

Specifically, $W_1$ is greater than or equal to 0.1 kW and smaller than 5 kW, and $W_2$ is greater than or equal to 5 kW and smaller than 20 kW.

Figure 7:
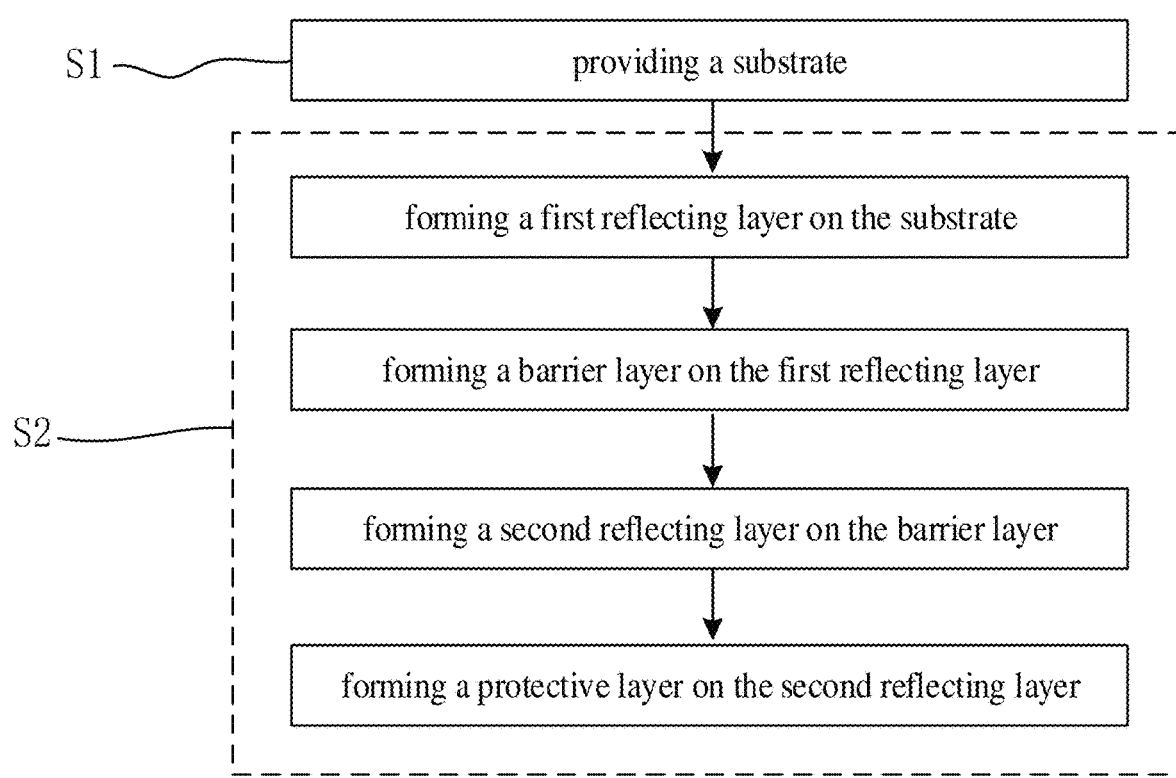
FIG. 7 is a flow diagram of a method for preparing a solar reflecting film according to another embodiment of the present disclosure.

As shown in FIG. 7, in step S2, a protective layer 125 is formed on a side of the second reflecting layer 123 away from the barrier layer 122 by magnetron sputtering.

Figure 8:
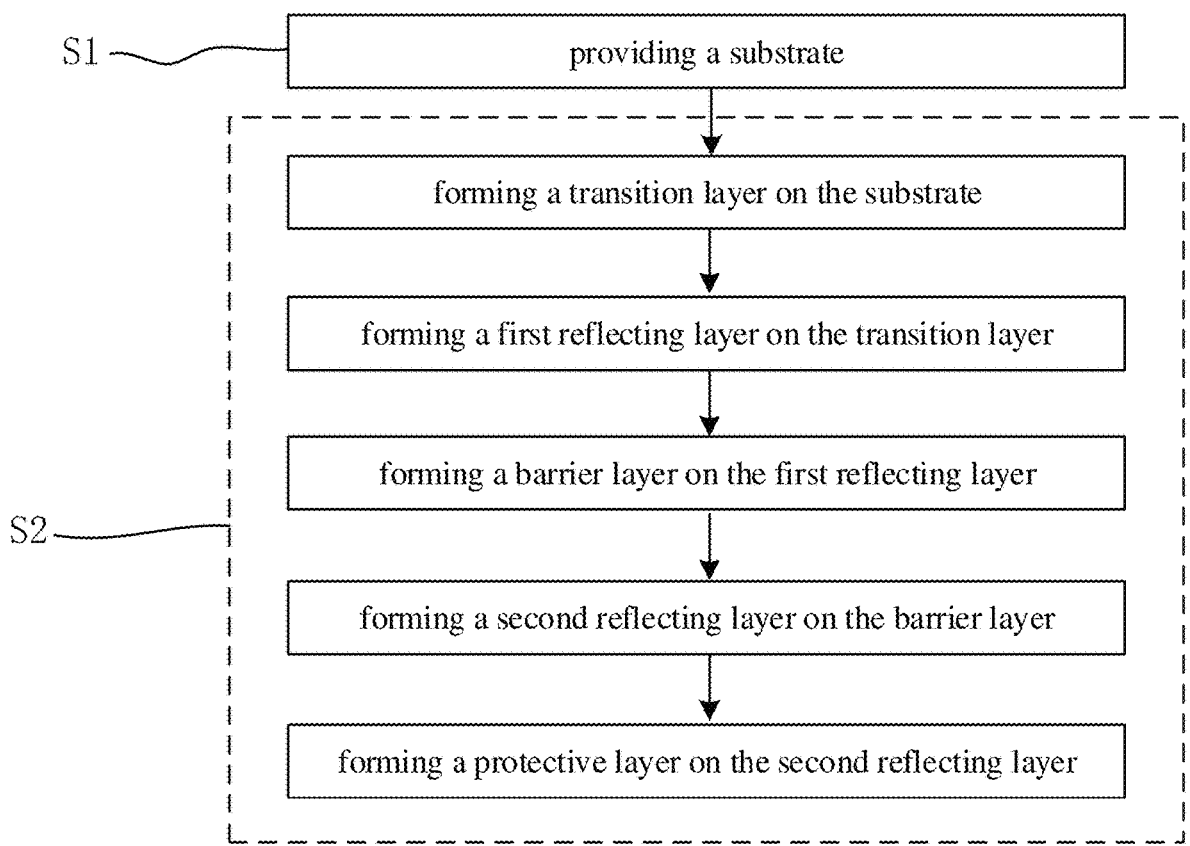
FIG. 8 is a flow diagram of a method for preparing a solar reflecting film according to another embodiment of the present disclosure.

As shown in FIG. 8, in step S2, a transition layer 124 is formed between the substrate 11 and the first reflecting layer 121 by magnetron sputtering.

Therefore, the solar reflecting film provided by the present disclosure has excellent reflectivity, aging resistance and oxidation resistance, and moreover, the preparation method of the solar reflecting film is simple, the cost is low and the service life is long.

The solar reflecting film provided by the present disclosure can be used in the fields of architecture, and as objects in the fields of solar photovoltaic, logistics storage and transportation, high-tech agriculture, outdoor products, electronic power, or aeronautics and astronautics.

In the field of architecture, the solar reflecting film can be used as the external surface of building glass; the external surface of building roof and external wall; the external surface of building waterproof membrane; the external surface of building steel plate and steel tile, and the like.

In the field of solar energy utilization, the solar reflecting film can be used as solar thermal power generation; solar focusing collector, and the like.

In the field of logistics storage and transportation, the solar reflecting film can be used as the external surface of the glass on the top of the vehicle; the external surface of the vehicle carriage, and the like.

In the field of high-tech agriculture, the solar reflecting film can be used as the external surface of agricultural greenhouses, and the like.

In the field of outdoor products, the solar reflecting film can be used as the outer surface of outdoor products, e.g., hats, clothing, tents, umbrellas, car covers, car awnings, and the like.

In the field of electronic power, the solar reflecting film can be used as the external surface of power cabinet, and the like.

In the field of aeronautics and astronautics, the solar reflecting film can be used as the outer surface of heat dissipation surface of spacecraft, and the like.

In the solar reflecting film 1 can be used to manufacture an object in the field of architecture, and as objects in the fields of solar photovoltaic, logistics storage and transportation, high-tech agriculture, outdoor products, electronic power or aeronautics and astronautics.

The object in the field of architecture can be such as glass for building, steel plate for building, steel tile for building, waterproofing membrane for building, and the like.

The object in the field of solar energy utilization can be such as solar photovoltaic backplane, solar photovoltaic module, and the like.

The object in the field of logistics storage and transportation can be such as glass for the top of transport vehicles, metal plates for transport vehicles, and the like.

The object in the field of high-tech agriculture can be such as agricultural curtain, agricultural glass, agricultural film, and the like.

The object in the field of outdoor products can be such as hats, clothing, tents, umbrellas, car covers, awnings, and the like.

The object in the field of electronic power can be such as metal plate for power cabinet, and the like.

The object in the field of aeronautics and astronautics can be such as heat dissipation surface of spacecraft, and the like.

The solar reflecting film and the preparation method thereof are further described below by a plurality of embodiments.

Preliminary preparation: placing a treated flexible PET substrate on an unwinding roller of an unwinding chamber and wrapping the treated flexible PET substrate on a winding roller; and placing the required target material on a target position corresponding to the cathode. Closing all chamber doors, opening the front-stage pump and molecular pump in turn, when the vacuum degree of the cavity reaches $5 \times 10^{-4}$ Pa, filling a process gas to a process vacuum, opening the cathode and driving roller to coating.

Pretreatment process of substrate: introducing argon into the vacuum chamber, raising the power of the ion source to 800 W to ionize the argon, and then the surface of flexible PET substrate is cleaned.

Formation of the transition layer: introducing sputtering gas Ar and $O_2$ with a purity of not less than 99.99% into a chamber according to a certain proportion, sputtering coating at a pressure of 0.3 Pa by an intermediate frequency magnetron sputtering, and an $Al_2O_3$ transition layer with a certain thickness is formed on the substrate of the comparative embodiments 2 to 3 and embodiments 2 to 4 by using a Al target material.

Formation of the first reflecting layer: depositing a target material on the substrate by magnetron sputtering to form a first layer with a thickness of 20 nm, wherein the supply power of the target material is $W_1$, that is 1 kW; then adjusting the supply power of the target material to $W_2$, that is 7 kW, and continuously depositing a second layer with a thickness of 25 nm on the first layer.

Formation of the barrier layer: introducing a sputtering gas Ar with a purity of not less than 99.99% into the chamber after the first reflecting layer is formed, sputtering coating at a pressure of 0.3 Pa by intermediate frequency magnetron sputtering, and forming the barrier layer with a certain thickness on the first reflecting layer by depositing the target material. In comparative embodiments, the barrier layer is a single-layer $TiO_2$ or $Nb_2O_5$ barrier layer; while in embodiments, the barrier layer includes a plurality of barrier layer units with a certain thickness and in a stacking state, wherein, the first barrier layer is an $Al_2O_3$ layer, the second barrier layer is a $TiO_2$ layer, and embodiment 3 further includes a third barrier layer, which is a $SiO_2$ layer.

Formation of the second reflecting layer: introducing a sputtering gas Ar with a purity of not less than 99.99% into the chamber after the barrier layer is formed, sputtering coating at a pressure of 0.3 Pa by an direct-current magnetron sputtering, and forming the Al layer with a certain thickness on the barrier layer by using Al target material. The composition of the Al layer corresponds to the Al target material.

Formation of the protective layer: introducing a sputtering gas Ar with a purity of not less than 99.99% into the chamber after the second reflecting layer is formed, sputtering coating at a pressure of 0.3 Pa by an intermediate frequency magnetron sputtering, and forming the protective layer with a certain thickness on the second reflecting layer of embodiments 1 to 3 by depositing the target material.

Formation of the composite adhesive layer and the protective film: after all the products pass through the process chamber and arrive at the winding chamber, opening the chamber door of the winding chamber after air inlet treatment, taking out the product from the winding chamber, coating a polyurethane adhesive layer on the second reflecting layer or the protective layer, and then attaching a PET protective film to the polyurethane adhesive layer.

According to the process, three comparative embodiments and four embodiments are provided, as shown in Table 1 and Table 2.

TABLE 1

| | Comparative embodiment 1 | | Comparative embodiment 2 | | Comparative embodiment 3 | |
| --- | --- | --- | --- | --- | --- | --- |
| | material | thickness | material | thickness | material | thickness |
| Substrate | PET | 23 µm | PET | 23 µm | PET | 23 µm |
| Transition layer | / | | $Al_2O_3$ | 10 nm | $Al_2O_3$ | 10 nm |
| First reflecting layer | Ag | 45 nm | Ag | 45 nm | Ag | 45 nm |
| Barrier layer | $TiO_2$ | 15 nm | $Nb_2O_5$ | 15 nm | $TiO_2$ | 20 nm |
| Second reflecting layer | Al | 50 nm | Al | 50 nm | Al | 50 nm |
| Protective layer | / | | | | | |
| Composite adhesive layer | 10 µm polyurethane adhesive | | | | | |
| Protective film | 50 µm BOPET | | | | | |
| Cross-cut adhesion | 0/100 | | 100/100 | | 100/100 | |
| Surface reflectivity R (%) | 93 | | 93 | | 93.1 | |
| Oxidation resistance time under high temperature and humidity test (h) | 50 | | 54 | | 55 | |
| Oxidation resistance time under salt spray test (h) | 12 | | 25 | | 27 | |

TABLE 2

| | Embodiment 1 | | Embodiment 2 | | Embodiment 3 | | Embodiment 4 | |
| --- | --- | --- | --- | --- | --- | --- | --- | --- |
| | material | thickness | material | thickness | material | thickness | material | thickness |
| Substrate | PET | 23 µm | PET | 23 µm | PET | 23 µm | PET | 23 µm |
| Transition layer | / | | $Al_2O_3$ | 10 nm | $Al_2O_3$ | 10 nm | $Al_2O_3$ | 10 nm |
| First reflecting layer | Ag | 45 nm | Ag | 45 nm | Ag | 45 nm | Ag | 45 nm |
| Barrier layer | $Al_2O_3$/$TiO_2$ Layered sputtering | 7.5 nm/ 7.5 nm | $Al_2O_3$/$TiO_2$ Layered sputtering | 7.5 nm/ 7.5 nm | $Al_2O_3$/$SiO_2$/$TiO_2$ Layered sputtering | 5nm/5nm/ 10 nm | $Al_2O_3$/$TiO_2$ Layered sputtering | 7.5 nm/ 7.5 nm |
| Second reflecting layer | Al | 50 nm | Al | 50 nm | Al | 50 nm | Al | 50 nm |
| Protective layer | $Al_2O_3$ | 20 nm | $Al_2O_3$ | 20 nm | $Al_2O_3$ | 20 nm | / | |
| Composite adhesive layer | 10 µm polyurethane adhesive | | | | | | | |
| Protective film | 50 µm BOPET | | | | | | | |
| Cross-cut adhesion | 0/100 | | 100/100 | | 100/100 | | 100/100 | |

TABLE 2-continued

|  | Embodiment 1 | | Embodiment 2 | | Embodiment 3 | | Embodiment 4 | |
| --- | --- | --- | --- | --- | --- | --- | --- | --- |
|  | material | thickness | material | thickness | material | thickness | material | thickness |
| Surface reflectivity R (%) |  | 93.2 |  | 93.3 |  | 94.2 |  | 93.3 |
| Oxidation resistance time under high temperature and humidity test (h) |  | 750 |  | 756 |  | 1099 |  | 734 |
| Oxidation resistance time under salt spray test (h) |  | 296 |  | 331 |  | 398 |  | 251 |

From the above data, at least the following information can be obtained:

It can be seen from comparative embodiment 1 and embodiment 1 that the time of yellow edge appearing in high temperature and high humidity test and salt spray test is significantly increased in the barrier layer of layered sputtering than that in the barrier layer made of single material. The layered sputtering can significantly improve the overall anti-oxidation performance of the solar reflecting film, especially the oxidation resistance time under salt spray test.

It can be seen from embodiment 1 and embodiment 2 that the transition layer can effectively improve the adhesive force and further improve the overall anti-oxidation performance of the solar reflecting film. The reason for the improvement of adhesion is that the transition layer can provide an adhesion foundation for the first reflecting layer.

It can be seen from embodiment 2 and embodiment 4 that the protective layer can effectively improve the anti-oxidation performance of the solar reflecting film.

According to embodiment 2, the structure and the thickness parameters of each layer are adjusted, and three comparative embodiments are provided, as shown in Table 3.

TABLE 3

|  | Comparative embodiment 4 | | Comparative embodiment 5 | | Comparative embodiment 6 | |
| --- | --- | --- | --- | --- | --- | --- |
|  | material | thickness | material | thickness | material | thickness |
| Substrate | PET | 23 μm | PET | 23 μm | PET | 23 μm |
| Transition layer | $Al_2O_3$ | 10 nm | $Al_2O_3$ | 10 nm | $Al_2O_3$ | 10 nm |
| First reflecting layer | Ag | 45 nm | Ag | 45 nm | Ag | 95 nm |
| Barrier layer | / | | / | / | / | / |
| Second reflecting layer | Al | 50 nm | / | | / | |
| Protective layer | $Al_2O_3$ | 20 nm | $Al_2O_3$ | 20 nm | $Al_2O_3$ | 20 nm |
| Composite adhesive layer |  |  | 10 μm polyurethane adhesive | | | |
| Protective film |  |  | 50 μm BOPET | | | |
| Cross-cut adhesion |  | 100/100 |  | 100/100 |  | 100/100 |
| Surface reflectivity R (%) |  | 93.2 |  | 82.0 |  | 93.1 |
| Oxidation resistance time under high temperature and humidity test (h) |  | 24 |  | 727 |  | 724 |
| Oxidation resistance time under salt spray test (h) |  | 3 |  | 253 |  | 249 |

It can be seen from comparative embodiment 4 and embodiment 2, when a barrier layer is located between the first reflecting layer and the second reflecting layer, the time of yellow edge appearing in high temperature and high humidity test and salt spray test can be significantly increased, and the overall anti-oxidation performance of the solar reflecting film can be significantly improved.

It can be seen from comparative embodiment 5 and embodiment 2 that the surface reflectivity of comparative embodiment 5 is 82.0%, which is 11.3% lower than that of embodiment 2. This indicates that if the thickness of the first reflecting layer is very thin and there is no second reflecting layer, the reflectivity of the solar reflecting film is not high.

It can be seen from comparative embodiment 6 and embodiment 2 that the surface reflectivity of comparative embodiment 6 is 93.1%, which is almost the same as that of embodiment 2, but the cost of embodiment 2 is reduced by about 45% compared with the cost of comparative embodiment 6.

Preliminary preparation, pretreatment process and formation of the transition layer: replacing the flexible PET substrate with a glass substrate, directly placing the glass substrate on the corresponding target material position, performing surface cleaning using the same method, and forming a $MgF_2$ transition layer on the surface of the substrate in embodiment 6 to 8.

Formation of the first reflecting layer: depositing a target material on the substrate by magnetron sputtering to form a first layer with a thickness of 20 nm, wherein the supply power of the target material is $W_1$ of 1 kW; then adjusting the supply power of the target material to $W_2$ of 7 kW; and continuously depositing a second layer with a thickness of 40 nm on the first layer.

Formation of the barrier layer: introducing a sputtering gas Ar with a purity of not less than 99.99% into the chamber after the first reflecting layer is formed, sputtering coating at a pressure of 0.3 Pa by intermediate frequency magnetron sputtering, forming the barrier layer with a certain thickness on the first reflecting layer by depositing the target material. In comparative embodiments, the barrier layer is a single-layer $ZrO_2$ or $Y_2O_3$ barrier layer, while in embodiments, the barrier layer includes a plurality of barrier layer units with a certain thickness and in a stacking state, wherein, the first barrier layer is the $YbF_3$ or $Y_2O_3$ layer, the second barrier layer is the $ZrO_2$ layer, and embodiment 7 further includes a third barrier layer, which is a $Y_2O_3$ layer.

The remaining processes are basically the same. According to the process, four embodiments and three comparative embodiments are provided, as shown in Table 4 and Table 5.

TABLE 4

| | Comparative embodiment 7 | | Comparative embodiment 8 | | Comparative embodiment 9 | |
| --- | --- | --- | --- | --- | --- | --- |
| | material | thickness | material | thickness | material | thickness |
| Substrate | glass | 3 mm | glass | 3 mm | glass | 3 mm |
| Transition layer | / | | | | | |
| First reflecting layer | Ag | 60 nm | Ag | 60 nm | Ag | 60 nm |
| Barrier layer | $ZrO_2$ | 15 nm | $Y_2O_3$ | 15 nm | $Y_2O_3$ | 20 nm |
| Second reflecting layer | Al | 55 nm | Al | 55 nm | Al | 55 nm |
| Protective layer | $Al_2O_3$ | 20 nm | $Al_2O_3$ | 20 nm | $Al_2O_3$ | 20 nm |
| Composite adhesive layer | 10 μm polyurethane adhesive | | | | | |
| Protective film | 50 μm BOPET | | | | | |
| Cross-cut adhesion | 0/100 | | 0/100 | | 0/100 | |
| Surface reflectivity R (%) | 93.3 | | 93.3 | | 93.2 | |
| Oxidation resistance time under high temperature and humidity test (h) | 55 | | 51 | | 62 | |
| Oxidation resistance time under salt spray test (h) | 27 | | 25 | | 30 | |

TABLE 5

| | Embodiment 5 | | Embodiment 6 | | Embodiment 7 | | Embodiment 8 | |
| --- | --- | --- | --- | --- | --- | --- | --- | --- |
| | material | thickness | material | thickness | material | thickness | material | thickness |
| Substrate | glass | 3 mm | glass | 3 mm | glass | 3 mm | glass | 3 mm |
| Transition layer | / | | $MgF_2$ | 12 nm | $MgF_2$ | 12 nm | $MgF_2$ | 12 nm |
| First reflecting layer | Ag | 60 nm | Ag | 60 nm | Ag | 60 nm | Ag | 60 nm |
| Barrier layer | $Y_2O_3$/$ZrO_2$ Layered sputtering | 7.5 nm/ 7.5 nm | $Y_2O_3$/$ZrO_2$ Layered sputtering | 7.5 nm/ 7.5 nm | $YbF_3$/$Y_2O_3$/$ZrO_2$ Layered sputtering | 5 nm/5 nm/ 10 nm | $Y_2O_3$/$ZrO_2$ Layered sputtering | 7.5 nm/ 7.5 nm |
| Second reflecting layer | Al | 55 nm | Al | 55 nm | Al | 55 nm | Al | 55 nm |
| Protective layer | $Al_2O_3$ | 20 nm | $Al_2O_3$ | 20 nm | $Al_2O_3$ | 20 nm | / | |

TABLE 5-continued

|  | Embodiment 5 | | Embodiment 6 | | Embodiment 7 | | Embodiment 8 | |
| --- | --- | --- | --- | --- | --- | --- | --- | --- |
|  | material | thickness | material | thickness | material | thickness | material | thickness |
| Composite adhesive layer | | | 10 μm polyurethane adhesive | | | | | |
| Protective film | | | 50 μm BOPET | | | | | |
| Cross-cut adhesion | 0/100 | | 100/100 | | 100/100 | | 100/100 | |
| Surface reflectivity R (%) | 93.6 | | 93.6 | | 94.5 | | 93.4 | |
| Oxidation resistance time under high temperature and humidity test (h) | 740 | | 758 | | 861 | | 743 | |
| Oxidation resistance time under salt spray test (h) | 301 | | 317 | | 380 | | 267 | |

It can be seen from comparative embodiment 7, comparative embodiment 8, and embodiment 5, when a composition of the barrier layer changes from $ZrO_2$ or $Y_2O_3$ to two layers barrier layer prepared by layered sputtering $ZrO_2$ and $Y_2O_3$, the oxidation resistance time under high temperature and humidity test increases from 55 h and 51 h to 740 h, respectively, and the oxidation resistance time under salt spray test increases from 27 h and 25 h to 301 h, respectively. The overall anti-oxidation performance of the solar reflecting film can be significantly improved.

It can be seen from embodiment 5 and embodiment 6, the transition layer can effectively improve the adhesive force and further improve the overall anti-oxidation performance of the solar reflecting film. It can be seen from embodiment 6 and embodiment 8, the protective layer can effectively improve the anti-oxidation performance, and particularly the oxidation resistance time under salt spray test.

In order to verify that the complex power method can improve the surface reflectivity of the first reflecting layer, the preparation method and comparative data of the first reflecting layer are provided below.

Embodiment 9

(1) providing a transparent plastic film as a substrate, and providing a simple silver as target material;

(2) depositing the target material on a substrate by magnetron sputtering to form a first layer with a thickness of 30 nm, wherein the supply power of the target material is $W_1$ of 1 kW;

(3) adjusting the supply power of the target material to $W_2$ of 7 kW, and continuously depositing a second layer with a thickness of 65 nm on the first layer.

Embodiment 10

(1) providing a transparent plastic film as a substrate, and providing a simple silver as target material;

(2) depositing the target material on a substrate by magnetron sputtering to form a first layer with a thickness of 30 nm, wherein the supply power of the target material is $W_1$ of 1 kW;

(3) adjusting the supply power of the target material to $W_2$ of 10 kW, and continuously depositing a second layer with a thickness of 65 nm on the first layer.

Embodiment 11

(1) providing a transparent plastic film as a substrate, and providing a simple silver as target material;

(2) depositing the target material on a substrate by magnetron sputtering to form a first layer with a thickness of 30 nm, wherein the supply power of the target material is $W_1$ of 4 kW;

(3) adjusting the supply power of the target material to $W_2$ of 20 kW, and continuously depositing a second layer with a thickness of 65 nm on the first layer.

Embodiment 12

(1) providing a transparent plastic film as a substrate, and providing a simple silver as target material;

(2) depositing the target material on a substrate by magnetron sputtering to form a first layer with a thickness of 30 nm, wherein the supply power of the target material is $W_1$ of 1 kW;

(3) adjusting the supply power of the target material to $W_2$ of 7 kW, and continuously depositing a second layer with a thickness of 65 nm on the first layer.

Comparative Embodiment 10

(1) providing a transparent plastic film as a substrate, and providing a simple silver as target material;

(2) depositing the target material on a substrate by magnetron sputtering to form a silver layer with a thickness of 95 nm, wherein the supply power of the target material is 7 kW.

Comparative Embodiment 11

(1) providing a transparent plastic film as a substrate, and providing a simple silver as target material;

(2) depositing the target material on a substrate by magnetron sputtering to form a silver layer with a thickness of 95 nm, wherein the supply power of the target material is 1 kW.

Comparative Embodiment 12

(1) providing a transparent plastic film as a substrate, and providing a simple silver as target material;

(2) depositing the target material on a substrate by magnetron sputtering to form a silver layer with a thickness of 95 nm, wherein the supply power of the target material is 4 kW.

Comparative Embodiment 13

(1) providing a transparent plastic film as a substrate, and providing a simple silver as target material;

(2) depositing the target material on a substrate by magnetron sputtering to form a silver layer with a thickness of 95 nm, wherein the supply power of the target material is 20 kW.

The surface reflectivity in the range of 300 nm to 2500 nm of the solar reflecting film in embodiments 9 to 12 and comparative embodiments 10 to 13 is measured, that is, the substrate is taken as the light incident side. The measurement results are shown in Table 6.

TABLE 6

| | Supply power | Thickness of the first reflecting layer | Surface reflectivity R |
|---|---|---|---|
| Embodiment 9 | $W_1$ = 1 kW, $W_2$ = 7 kW | 95 nm | 93.3% |
| Embodiment 10 | $W_1$ = 1 kW, $W_2$ = 10 kW | 95 nm | 93.4% |
| Embodiment 11 | $W_1$ = 4 kW, $W_2$ = 20 kW | 95 nm | 93.2% |
| Embodiment 12 | $W_1$ = 1 kW, $W_2$ = 7 kW | 95 nm | 93.6% |
| Comparative embodiment 10 | W = 7 kW | 95 nm | 91.6% |
| Comparative Embodiment 11 | W = 1 kW | 95 nm | 91.5% |
| Comparative Embodiment 12 | W = 4 kW | 95 nm | 91.4% |
| Comparative Embodiment 13 | W = 20 kW | 95 nm | 91.3% |

The surface reflectivity or full spectral reflectivity in the present disclosure refers to the average of the reflectivity of the sample in the spectrum of 300 nm to 2500 nm.

Taking the data of embodiment 9 and comparative embodiment 10 as an example, the reflectivity of the incident side of the first layer of the film is increased from 91.6% to 93.3%, that is, the light to be absorbed is reduced from 8.4% to 6.7%, with a decrease of 1.7%, it is roughly estimated that the heat to be absorbed by the film is greatly reduced, and the cooling effect will be increased by about 20.23%.

The above experimental data is obtained according to the following method:

Yellow edge appearance time, anti-oxidation performance, high temperature and high humidity test: cutting the solar reflecting film into 60 mm×60 mm small pieces as samples, and placing the samples into a wet heat aging box with temperature of 60° C. and relative humidity of 90%. Observing and recording the time when a yellow edge appears on an edge of the film, this time is taken as the oxidation resistance time of the solar reflecting film under high temperature and high humidity.

Yellow edge appearance time, anti-oxidation performance, and salt spray test: cutting the solar reflecting film into 60 mm×60 mm small pieces as samples. Please refer to Section 5.2 of GB/T10125-2012 for the test method. Observing and recording the time when a yellow edge appears on an edge of the film, this time is taken as the oxidation resistance time of the solar reflecting film under salt spray test.

The surface reflectivity R: the reflectivity of substrate surface is measured with platinum Elmer's lambda950 at an incident angle of 5°, and the average reflectivity of the full spectrum (wavelength in a range of 0.3 μm to 2.5 μm) is calculated as the value of the surface reflectivity R. In addition, the incident angle refers to the angle relative to the straight line perpendicular to the film surface.

Cross-cut adhesion and cross-cut tape peeling test: before locating the composite adhesive layer and the protective film, cutting the coating film of the solar reflecting film, and the coating film is cut into 100 small parts. Firmly sticking the adhesive tape (model 3M-610) to the film surface, and peeling the adhesive tape evenly with force. Confirming whether the parts of the film surface are peeled off. If all parts are not peeled off, it is expressed as 100/100, and if all parts are peeled off, it is expressed as 0/100.

Application Case 1

Figure 9:
FIG. 9 is a schematic diagram of a temperature measuring point in the model house.

In order to simulate the cooling effect of the solar reflecting film on building interior, two model houses A and B as shown in FIG. 9 are selected in the same environment in Shenzhen city. The outer surface of model B is not treated and the outer surface of model A is provided with the solar reflecting film of embodiment 2. Temperature measurement points A1 and B1 are installed in the middle area of model A and model B, respectively. Ambient temperature measurement point is installed beside the model house. Continuously collecting temperature data of temperature measurement points A1, B1 and ambient temperature between Oct. 17, 2019 and Oct. 25, 2019, the temperature curves are shown in FIG. 10.

Figure 10:
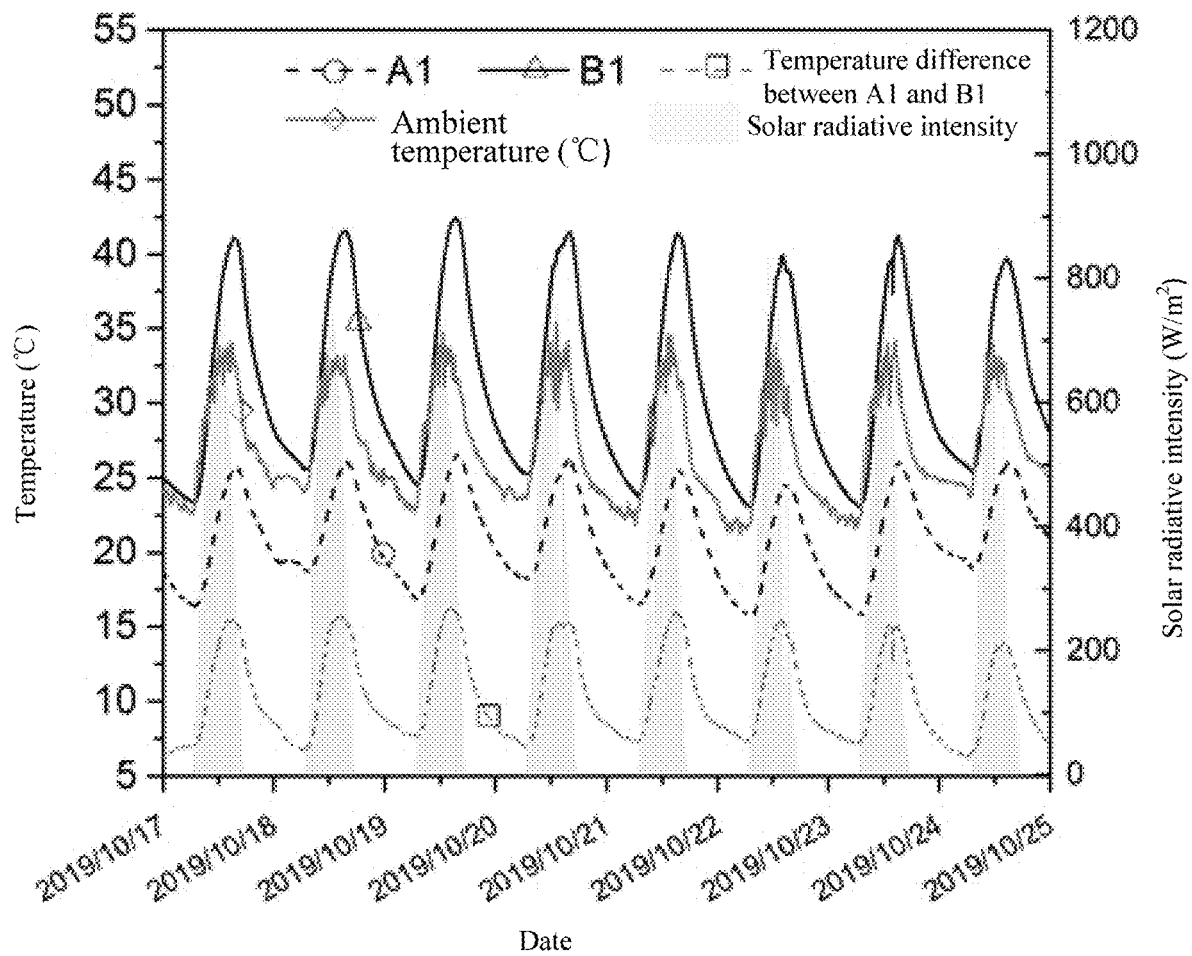
FIG. 10 is a schematic diagram illustrating the internal temperature of the model house shown in FIG. 9 with the solar reflecting film and without the solar reflecting film, and the ambient temperature.

It can be seen from FIG. 10 that the solar reflecting film can effectively reduce the internal temperature of the model house, and the maximum contrast temperature difference between model A and model B is 15° C. The solar radiative intensity reaches the maximum before and after noon every day, and the temperature difference between the two model houses is the largest at that moment. The overall temperature of the model house can be continuously and effectively reduced through the solar reflecting film, which can save energy and protect environmental.

Application Case 2

The power grid cabinet with internal heat source is generally set outdoors and in an operating state for a long time. In high temperature weather, the power grid cabinet is in high temperature state for a long time, and the equipment components are in risk. Therefore, it is necessary to cool the power grid cabinet to reduce the load pressure of the power grid, so as to reduce the failure rate, maintenance cost and safety risks.

Figure 11:
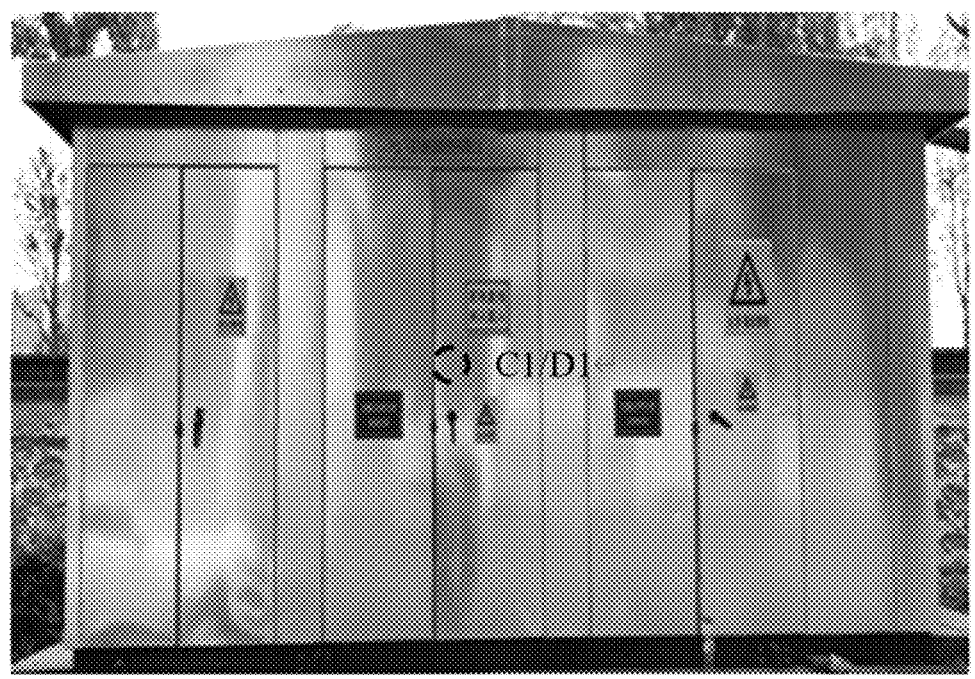
FIG. 11 is a schematic diagram of a temperature measuring point in the power grid cabinet.

Two power grid cabinets C and D, as shown in FIG. 11, are selected in the same environment in Ningbo City. The outer surface of C cabinet is not treated, and the outer surface of D cabinet is provided with the solar reflecting film of embodiment 3. Temperature measurement points C1 and D1 are respectively installed in the middle area of the two cabinets C and D. Continuously collecting temperature data of the temperature measurement points C1 and D1 between Jul. 28, 2019 and Aug. 3, 2019, the temperature curves are shown in FIG. 12.

Figure 12:
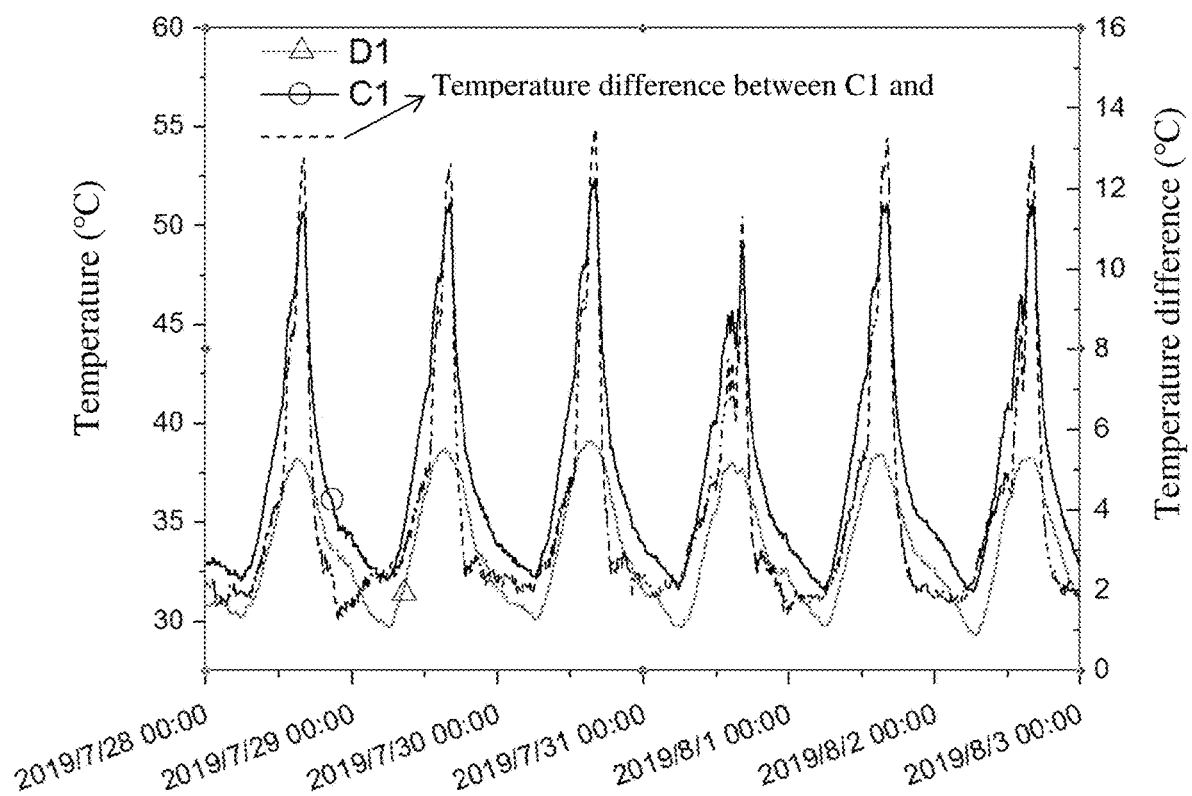
FIG. 12 is a schematic diagram illustrating the internal temperature of the power grid cabinet shown in FIG. 11 with the solar reflecting film and without the solar reflecting film, respectively.

It can be seen from FIG. 12 that the solar reflecting film can continuously and effectively reduce the overall temperature of the power grid cabinet. Compared with the power grid cabinet without the solar reflecting film, the maximum temperature drop can reach 14° C., which can reduce the load pressure of the power grid, reduce the failure rate, the maintenance cost, and the potential safety hazard.

Application Case 3

Figure 13:
FIG. 13 is a schematic diagram of a temperature measuring point in the carriage.

In order to simulate the cooling effect of the solar reflecting film on the carriage, two refrigerated semitrailer E and F as shown in FIG. 13 are selected in the same environment in Qingdao city. The model and configuration of the two vehicles E and F are the same. The length, width and height of the two vehicles are 14600 mm, 2600 mm and 3000 mm respectively. The outer surface of vehicle E is not treated, and the top surface of vehicle F is pasted a 38 $m^2$ solar reflecting film of embodiment 3. The film area on the roof accounts for 27% of the total area of the vehicle. Temperature measuring points E1 and F1 are respectively installed in the upper middle parts of the two vehicles. Ambient temperature measuring points are installed beside the vehicle. Continuously collecting temperature data of E1, F1 and ambient temperature on May 28, 2019, the temperature curves are shown in FIG. 14.

Figure 14:
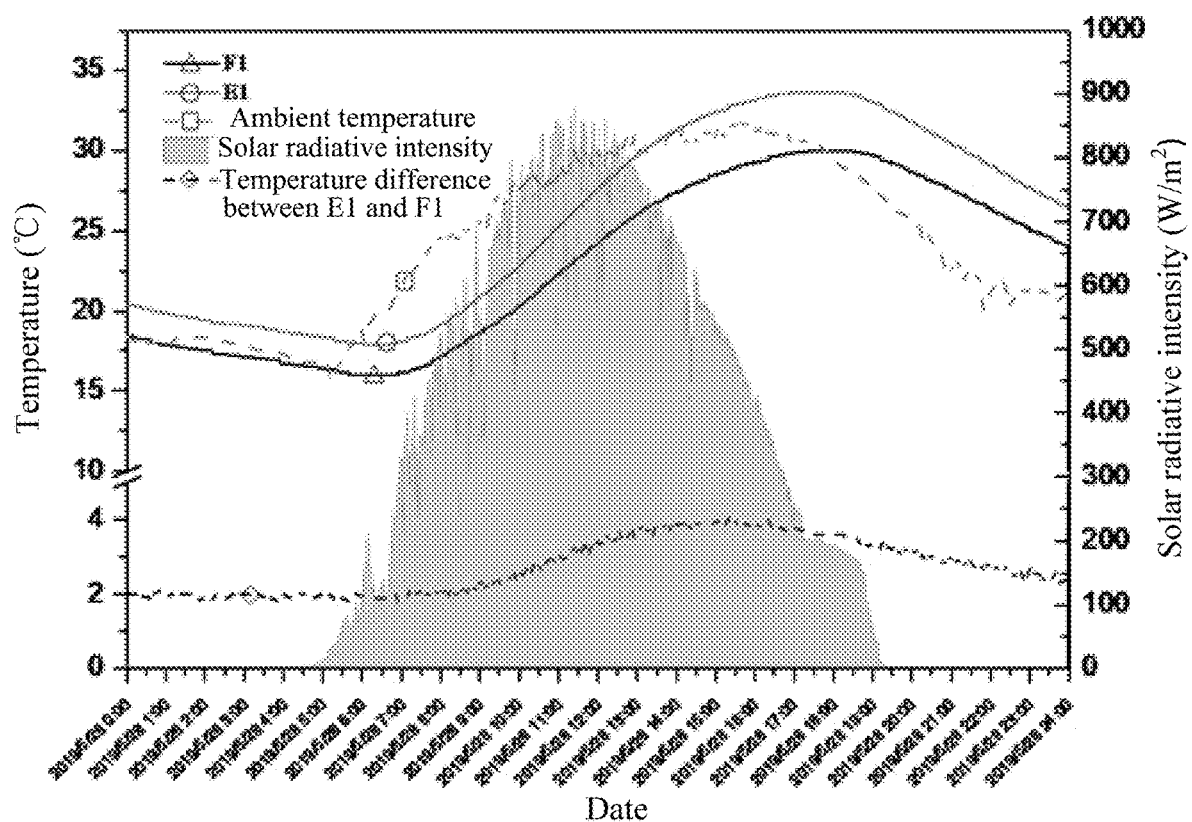
FIG. 14 is a schematic diagram illustrating the internal temperature of the carriage shown in FIG. 13 with the solar reflecting film and without the solar reflecting film, and the ambient temperature.

It can be seen from FIG. 14 that even if the solar reflecting film is pasted at the top of the refrigerated semitrailer, the temperature inside the vehicle can be effectively reduced, compared with the vehicle without the solar reflecting film, the maximum contrast temperature difference reaches 4° C.; the overall temperature of the vehicle can be continuously and effectively reduced through the solar reflecting film, which can obviously improve the operation environment, and reduce the failure rate, the maintenance cost, and the potential safety hazard.

In order to further simulate the cooling effect of the solar reflecting film, opening the doors of the refrigerated semitrailer E and F, when the temperature in the refrigerated semitrailer E and F is the same as the ambient temperature, closing the doors of the refrigerated semitrailer E and F, turning on the air conditioner and setting the temperature of the refrigerated semitrailer E and F to −20° C., then recording the time required from the ambient temperature to −20° C.

TABLE 7

Time required for E and F to reduce from ambient temperature to a set temperature

| | Starting time | Ending time | Time required |
|---|---|---|---|
| E | 9:02 | 10:52 | 1:50 |
| F | 9:02 | 10:25 | 1:23 |

It can be seen from Table 7 that the time of the refrigerated semitrailer with the solar reflecting film is 27 minutes less than that of the refrigerated semitrailer without the solar reflecting film, which saved 24.5 percent of the time.

In order to simulate the oil-saving effect of the solar reflecting film on the refrigerated semi-trailer, emptying the tank of refrigerated semitrailer E and F, then accurately weighing a certain amount of diesel oil and adding into the two vehicles. Opening the doors of the refrigerated semitrailer E and F, when the temperature in the refrigerated semitrailer E and F is the same as the ambient temperature, closing the doors of the refrigerated semitrailer E and F, turning on the air conditioner and setting the temperature of the refrigerated semitrailer E and F to −20° C., after a period of time, putting the remaining oil of the two vehicles into the measuring cup, and accurately weighing the remaining oil of the two vehicles, obtaining the accurate oil consumption of the two vehicles.

TABLE 8

Oil consumption of E and F in a certain time

| | Oil consumption of vehicle E | Oil consumption of vehicle F |
|---|---|---|
| 2019/6/25 8:30~2019/6/26 8:30 | 40.24 L | 30.12 L |
| 2019/6/25 8:30~2019/6/27 8:30 | 78.03 L | 54.35 L |
| 2019/6/25 8:30~2019/6/28 8:30 | 115.31 L | 78.65 L |

Continuously test the oil consumption of the two vehicles from Jun. 25, 2019 to Jun. 28, 2019. It can be seen from the above table that the oil consumption of vehicle F with solar reflecting film is significantly lower than that of vehicle E without the solar reflecting film, and the oil saving rate is 32%. With the extension of the running time, the oil saving rate of the vehicle F will be higher.

The above embodiments are only used to explain the technical solutions of the present disclosure and are not limited thereto. Those skilled in the art should understand that they can still modify the technical solutions described in the above embodiments, or some technical features are equivalently substituted; and these modifications or substitutions do not detract from the essence of the corresponding technical solutions from the spirit and scope of the technical solutions of the embodiments of the present disclosure.

We claim:

1. A solar reflecting film, comprising a substrate and a functional layer, the functional layer comprising a first reflecting layer, a barrier layer and a second reflecting layer stacked on the substrate in order;
   wherein the barrier layer comprises a first barrier layer and a second barrier layer stacked on the first barrier layer;
   the first barrier layer is metal fluoride, inorganic non-metallic oxide, metal oxide or a combination thereof;
   the second barrier layer is metal oxides, metal nitrides, semiconductor doped compounds or a combination thereof; and
   a material of the first barrier layer is at least partially different from that of the second barrier layer,
   the barrier layer further comprises a third barrier layer between the first barrier layer and the second barrier layer, a material of the third barrier layer is metal fluoride, inorganic non-metal oxide, metal oxide, metal nitride, semiconductor doping compound, or a combination thereof, and
   a material of the third barrier layer is at least partially different from that of the first barrier layer and that of the second barrier layer.

2. The solar reflecting film of claim 1, wherein the functional layer further comprises a protective layer located on a side of the second reflecting layer away from the barrier layer.

3. The solar reflecting film of claim 2, wherein a material of the protective layer is metal fluoride, inorganic non-metal oxide, metal oxide, metal nitride, non-metal nitride, semiconductor doping compound, or a combination thereof.

4. The solar reflecting film of claim 2, wherein the functional layer further comprises a transition layer between the substrate and the first reflecting layer.

5. The solar reflecting film of claim 4, wherein a material of the transition layer is metal fluoride, inorganic non-metal oxide, metal oxide, metal nitride, non-metal nitride, semiconductor doping compound, or a combination thereof.

6. The solar reflecting film of claim 4, further comprising a composite adhesive layer and a protective film which are located on a surface of the functional layer away from the substrate in order.

7. The solar reflecting film of claim 6, wherein a sum of the thickness of the functional layer is less than or equal to 200 nm, a reflectivity of the solar reflecting film at wavelength of 300 nm to 2500 nm is greater than or equal to 90%, an anti-oxidation time of the solar reflecting film at 60° C. and 90% relative humidity is more than or equal to 720 hours, and a salt spray resistance time of the solar reflecting film is more than or equal to 240 hours.

8. The solar reflecting film of claim 7, wherein a thickness of the protective layer is in a range of 1 nm to 50 nm, and/or
a thickness of the transition layer is in a range of 0.1 nm to 50 nm, and/or
a thickness of the first reflecting layer is in a range of 20 nm to 120 nm, and/or
a thickness of the second reflecting layer is in a range of 20 nm to 150 nm, and/or
a thickness of the barrier layer is in a range of 10 nm to 45 nm.

9. The solar reflecting film of claim 8, wherein the first reflecting layer comprises a first layer and a second layer, the second layer is located on a side of the first layer away from the substrate, a thickness of the first layer is in a range of 0.1 nm to 40 nm, and a thickness of the second layer is in a range of 20 nm to 80 nm.

10. The solar reflecting film of claim 1, wherein a thickness of the substrate is in a range of 1 μm to 10000 μm, a light transmittance of the substrate at a wavelength of 300 nm to 2500 nm is greater than or equal to 80%.

11. The solar reflecting film of claim 1, wherein a material of the substrate is at least one of glass, poly (4-methyl-1-pentene), polyethylene terephthalate, polyethylene naphthalate, poly 1,4-cyclohexylene dimethylene terephthalate, poly (ethylene terephthalateco-1, 4-cyclohexylene dimethylene terephthalate), poly (ethylene terephthalate-acetate), polymethyl methacrylate, polycarbonate, acrylonitrile styrene copolymer, acrylonitrile-butadiene styrene terpolymer, polyvinyl chloride, polypropylene, polyethylene, ethylene-propylene-diene monomer, polyolefin elastomer, polyamide, ethylene-vinyl acetate copolymer, ethylene-methyl acrylate copolymer, polyhydroxyethyl methacrylate, polytetrafluoroethylene, teflon perfluoroalkoxy, polytrifluorochloroethylene, ethylene-chlorotrifluoroethylene copolymer, ethylene-tetrafluoroethylene copolymer, polyvinylidene fluoride and polyfluoroethylene, thermoplastic polyurethane, and polystyrene.

12. The solar reflecting film of claim 1, wherein a material of the first reflecting layer is silver or silver alloy, and a material of the second reflecting layer is Al, Ti, Cu, W, or Ta.

13. The solar reflecting film of claim 1, wherein the metal fluoride is at least one of $MgF_2$, $BaF_2$, $YF_3$, $YbF_3$, $GdF_3$, $LaF_3$, and $AlF_3$, the inorganic non-metal oxide is $SiO_2$, the metal oxide is at least one of $Y_2O_3$, $Al_2O_3$, ZnO, SnO, $TiO_2$, $Ta_2O_5$, $Nb_2O_5$, $ZrO_2$, and $HfO_2$, the metal nitride is at least one of $Mg_3N_2$, AlN, CrN, NiCrNx, HfN, TaN, TiN, TiAlN, and ZrN, and the semiconductor doping compound is at least one of AZO, ITO, IZO, ZTO, and GZO.

14. The solar reflecting film of claim 1, wherein the first barrier layer has at least one of the following features: a stress value is in a range of −5 GPa to −0.01 GPa, a refractive index is in a range of 1.3 to 1.8, and a thickness is in a range of 5 nm to 15 nm;
the second barrier layer has at least one of the following features: a stress value is in a range of −5 GPa to −0.01 GPa, a refractive index is in a range of 1.8 to 2.5, and a thickness is in a range of 5 nm to 15 nm; and
the third barrier layer has at least one of the following features: a stress value is in a range of −5 GPa to −0.01 GPa, a refractive index is in a range of 1.8 to 2.5, and a thickness is in a range of 5 nm to 15 nm.

15. The solar reflecting film of claim 1, wherein a thickness relationship among the first barrier layer, the second barrier layer and the third barrier layer meets either one of the following two ratios,
a ratio of $\delta_1$ and $\delta_2$ is in a range of 3:1 to 1:3, or
a ratio of $\delta_1$, $\delta_2$ and $\delta_3$ is in a range of 3:1:1 to 1:3:3
wherein a thickness of the first barrier layer is defined as $\delta_1$, a thickness of the second barrier layer is defined as $\delta_2$, and a thickness of the third barrier layer is defined as $\delta_3$.

16. A method for preparing a solar reflecting film, comprising:
providing a substrate; and
forming a functional layer on the substrate by magnetron sputtering method, to obtain the solar reflecting film, wherein the functional layer comprises a first reflecting layer, a barrier layer and a second reflecting layer stacked on the substrate in order, and the barrier layer comprises a first barrier layer and a second barrier layer stacked on each other,
wherein the method further comprises forming a third barrier layer between the first barrier layer and the second barrier layer, a material of the third barrier layer is metal fluoride, inorganic non-metal oxide, metal oxide, metal nitride, semiconductor doping compound, or a combination thereof, and
a material of the third barrier layer is at least partially different from that of the first barrier layer and that of the second barrier layer.

17. The method of claim 16, further comprising:
providing a target material;
depositing the target material on the substrate by a magnetron sputtering method to form a first layer, wherein a supply power of the target material is a first power $W_1$; and
adjusting the supply power of the target material to a second power $W_2$ and depositing a second layer on the first layer, wherein $W_2$ is greater than $W_1$, and the first layer and the second layer together form the first reflecting layer.

18. The method of claim 17, wherein $W_1$ is greater than or equal to 0.1 kW and smaller than 5 kW, and $W_2$ is greater than or equal to 5 kW and smaller than 20 kW.

19. The method of claim 16, further comprising: forming a protective layer on a side of the second reflecting layer away from the barrier layer by a magnetron sputtering method; and/or
forming a transition layer between the substrate and the first reflecting layer by a magnetron sputtering method.

* * * * *